United States Patent
Waczynski et al.

Patent Number: 6,034,367
Date of Patent: Mar. 7, 2000

[54] BIASING ARRANGEMENT FOR LINEAR DETECTOR ARRAY

[75] Inventors: Augustyn Waczynski; John S. Mazurowski, both of Indiana, Pa.; Dean S. Grinch, Dublin, Ohio

[73] Assignee: Diasense, Inc., Pittsburgh, Pa.

[21] Appl. No.: 09/011,568

[22] PCT Filed: Aug. 15, 1996

[86] PCT No.: PCT/US96/13336

§ 371 Date: Sep. 24, 1998

§ 102(e) Date: Sep. 24, 1998

[87] PCT Pub. No.: WO97/07528

PCT Pub. Date: Feb. 27, 1997

Related U.S. Application Data

[60] Provisional application No. 60/002,347, Aug. 15, 1995.

[51] Int. Cl.[7] .............................. H01J 40/14; G01T 1/22
[52] U.S. Cl. ...................................... 250/208.2; 250/214.1
[58] Field of Search ............................ 250/208.2, 208.3, 250/214.1, 214 R, 370.08, 370.13, 332, 334

[56] References Cited

U.S. PATENT DOCUMENTS

| | | | |
|---|---|---|---|
| 4,531,059 | 7/1985 | McCullough et al. | 250/370 |
| 4,535,232 | 8/1985 | Elliott et al. | 250/214 R |
| 4,551,623 | 11/1985 | Elliott et al. | 250/214 R |
| 4,565,928 | 1/1986 | Yamamoto et al. | 250/578 |
| 4,628,203 | 12/1986 | Reine et al. | 250/334 |

*Primary Examiner*—John R. Lee
*Attorney, Agent, or Firm*—Webb Ziesenheim Logsdon Orkin & Hanson, P.C.

[57] ABSTRACT

A detector includes a plurality of detector elements in a linear array. A bias source is connected to the input terminal of each detector element. The bias source includes a first bias connected to the input terminals of a first set of detector elements including alternating detector elements and is also connected through an associated measurement device to the output terminals of a second set of detector elements including the remaining detector elements. The bias source also includes a second bias, different from the first bias, and connected through an associated measurement device to the output terminals of the first set of detector elements. The second bias is also connected to the input terminals of the second set of detector elements.

18 Claims, 4 Drawing Sheets

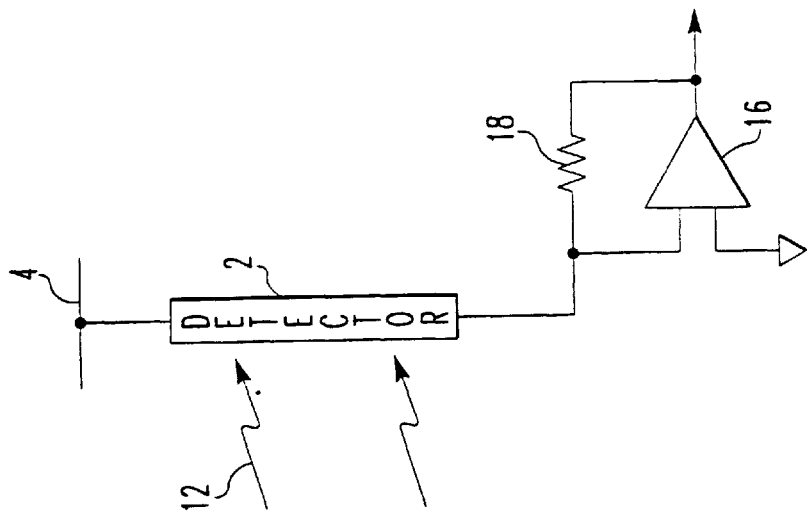
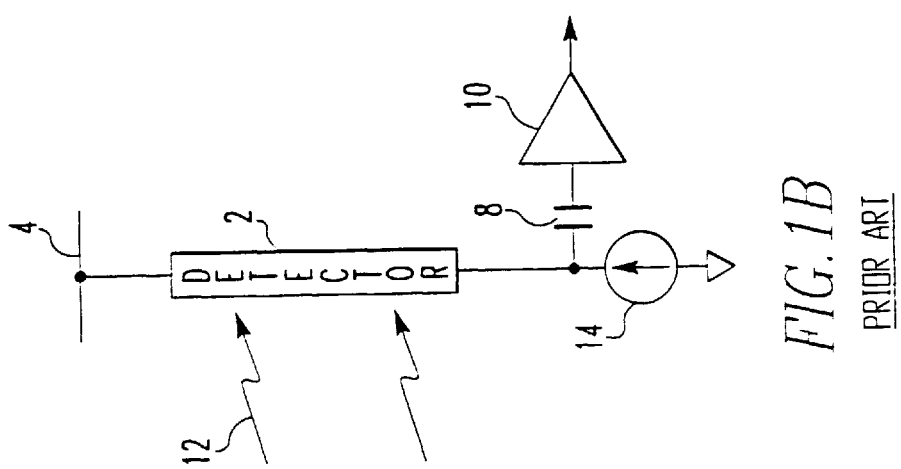
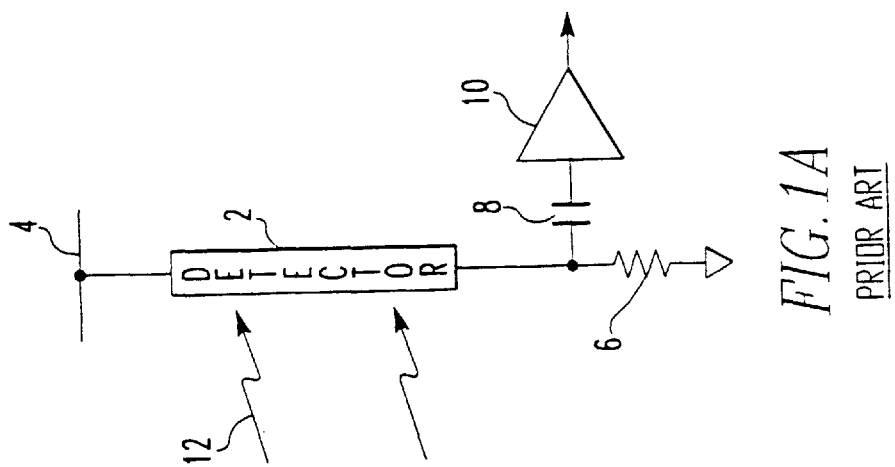

1

BIASING ARRANGEMENT FOR LINEAR DETECTOR ARRAY

This application claims priority from United States Provisional patent application Ser. No. 60/002,347, filed on Aug. 15, 1995, entitled "Novel Method of Biasing Photoconductive Linear Detector Array."

BACKGROUND OF THE INVENTION

1. Field of the Invention

This invention relates to detectors and, more particularly, to the biasing of a linear array of photoconductive detectors.

2. Background Art

The use of photoconductive detectors for measuring radiation is well-known. Because of their high sensitivity, photoconductive detectors such as PbS and PbSe are particularly effective in measuring infrared radiation. Detection of infrared radiation is used by the military for tracking warm vehicles and in night vision devices, is used by medical instrument manufacturers for measuring glucose and other body constituents in a noninvasive manner and is used by scientific instrument manufacturers for measuring chemical composition and structure.

In general, the resistance of the photoconductive detector changes when the radiation falls on its surface. Resistance changes can be measured as an electrical signal change and the intensity of the detected radiation can be estimated by the magnitude of resistance change.

Photoconductive detectors typically require a bias current or voltage to operate, such as a direct current bias. The sensitivity of the detector is proportional to the magnitude of the applied bias. It is preferred to supply a high bias to such a detector to increase its sensitivity and to overcome the noise of the electronics associated with the detector in an overall detection system.

The bias can be delivered to the detector in various manners, including a voltage divider, a constant current or a constant voltage. FIG. 1A shows a known voltage divider arrangement in which a detector 2 is attached at one end to a bias electrode 4 and is connected at its other end to a load resistor 6 which is grounded. The voltage across the load resistor 6 is supplied through capacitor 8 to amplifier 10 which generates an output signal related to the intensity of the radiation 12 impinging upon the detector 2. In the voltage divider arrangement, the incident radiation 12 modulates the resistance of the detector 2 and, consequently, changes the current flowing through the detector 2 and the load resistor 6. These current changes are converted to voltage changes across the load resistor 6. The AC components of the voltage changes are passed through capacitor 8 to the amplifier 10 for further processing.

FIG. 1B shows a constant current mode of operation in which the detector 2 is connected to the bias electrode 4 and to a constant current source 14. As discussed above, the voltage drop across the detector 2 changes with incident radiation 12 and these voltage changes are coupled to amplifier 10 through capacitor 8.

A constant voltage mode of operation is shown in FIG. 1C. In this mode of operation, radiation induced resistance changes in the detector 2 are quantified by measuring the current flowing through the detector 2. This is typically accomplished by direct coupling of the detector 2 to the input of a current-to-voltage converter, often identified as a "transimpedance amplifier". The transimpedance amplifier shown in FIG. 1C includes operational amplifier 16 having one input terminal grounded and the other input terminal connected to the detector 2. Feedback resistor 18 extends between the output terminal of operational amplifier 16 and its input terminal receiving the output of the detector 2. The detector 2 is also connected to the bias electrode 4.

The bias voltage applied to a photoconductive detector also causes current to flow in the absence of incident radiation. This current, referred to as the "dark current", is usually large when compared to the current changes resulting from incident radiation. The detection of the small, radiation related signal, which is added to the large, dark signal, is often difficult. A typical arrangement for detecting the radiation related signal is shown in FIG. 2. Radiation from a radiation source 20, which could be a source of infrared radiation, passes through and is modulated by a modulator 22, such as a rotating slotted chopper disk, and then impinges upon a photoconductive detector 24. The arrangement shown in FIG. 2 is a constant voltage mode of operation in which a DC bias voltage is applied to the detector 24 from bias voltage source 26 and the output of the detector 24 is passed through a transimpedance amplifier 28 as discussed above in connection with FIG. 1C. The detector 24 converts the modulated radiation 30 into an electrical signal and the transimpedance amplifier 28 amplifies both the AC signal associated with the radiation 30 and the associated dark signal. Modulated detection, or preferably synchronous detection, is used to overcome the problem associated with the dark signal. The AC component of the signal generated by the transimpedance amplifier 28 is separated from the DC dark signal by coupling capacitor 32. The resulting AC component from the coupling capacitor 32 can be rectified synchronously with an external reference (not shown) derived from the modulator 22. The rectified signal from coupling capacitor 32 is passed through low pass filter 34, which can also include amplification, to reduce noise. The filtered signal is then digitized by an analog-to-digital converter 36 and the resultant digital signal can be used as desired.

It is common to use a plurality of photoconductive detector elements in the form of a linear array to measure radiation across a spectrum of wavelengths. Each detector element is responsive to and detects a particular wavelength, or band of wavelengths, of radiation. As shown in FIG. 3, a plurality of elongated photoconductive detector elements 40–46, also referred to as pixels, is shown mounted on a common substrate 48. Regardless of the type of biasing arrangement used, each element or pixel of the array will have one terminal, referred to as the input terminal, connected to a common electrode associated with the biasing source and another terminal, referred to as the output terminal, connected to the measuring scheme, which also provides a bias return path. As a result, the output terminals of the detector elements constitute a majority of the wiring and packaging feed-throughs from the substrate to the remainder of the system in which the substrate having the linear detector array is mounted. Rather than distribute the bias source along only one side of the detector array, i.e., with all of the input terminals of the detector elements aligned along one side of the substrate and with all of the output terminals of the detector elements aligned along the other side of the substrate, it is typical to distribute the input and output terminals of the detector elements evenly on both sides of the linear array structure as shown in FIG. 3. This configuration permits the design to be arranged such that the packaging is symmetrical and the interconnections are simplified. As can be seen in FIG. 3, the measurement devices, here transimpedance amplifiers 50–56, connected to the output terminals of detector elements 40–46, respectively, are evenly distributed on opposite sides of the substrate 48, rather than all being positioned on one side. Typically, odd detector elements in the array have their output terminals on one side of the substrate 48 while even detector elements in the array have their output terminal on the other side of the substrate 48. Such a configuration is often referred to as an "interdigitated" or "interlaced" arrangement. The arrangement shown in FIG. 3 is a constant voltage mode of operation, including a bias voltage source 58 supplying a bias voltage $V_b$ to the input terminal of each detector element 40–46 through a single bias electrode 60 on the substrate 48, and including a transimpedance amplifier 50–56 connected to the output terminal of each detector element 40–46. The single bias electrode 60 extends on the substrate along the length of the array and on each side of the detector elements. However, other biasing arrangements can also be utilized.

The interdigitated design shown in FIG. 3 results in potential differences between neighboring detector elements. This is shown in FIG. 3 where, for example, detector element 40 has the bias voltage $V_b$ applied to its input terminal while the immediately adjacent detector element 41 has a zero voltage at its output terminal which is immediately adjacent the input terminal of detector element 40. The opposite situation is shown at the opposite ends of detector elements 40 and 41 where the bias voltage $V_b$ is applied to the input terminal of detector element 41 which is adjacent the output terminal of detector element 40 having a zero voltage thereupon. The difference in voltage between the ends of adjacent detector elements 40 and 41 is the bias voltage $V_b$. In the typical microcircuit arrangements in which these linear detector arrays are configured, the distance between the adjacent detector elements can be as small as 0.001 inch in a medium resolution array. Even a relatively low bias voltage can result in a high electrical field between the adjacent ends of adjacent detector elements. This high electrical field can encourage the migration of surface contaminants to these areas and create leakage currents therebetween. This configuration results in an increase in noise and instability and, with time, may lead to the failure of the array.

It is, therefore, an object of the present invention to minimize these problems of the prior art interdigitated linear arrays and minimize or eliminate the potential difference and resulting electric field between adjacent detector elements in the array while preserving the small, compact design of a microcircuit arrangement.

SUMMARY OF THE INVENTION

Accordingly, we have developed a detector which includes a plurality of separate detector elements arranged on a substrate in a linear array. Each detector element has an input terminal and an output terminal. Each detector element is positioned on the substrate such that the input terminal of each detector element is adjacent the output terminal of a detector element immediately adjacent thereto and the output terminal of each detector element is adjacent the input terminal of a detector element immediately adjacent thereto. A bias source is connected to the input terminal of each detector element and a measurement device is connected to the output terminal of each detector element. The bias source includes a first bias connected to the input terminals of a first set of detector elements including alternating detector elements. The first bias is also connected through an associated measurement device to the output terminals of a second set of detector elements including the remaining detector elements. The bias source also includes a second bias different from the first bias and connected through an associated measurement device to the output terminals of the first set of detector elements. The second bias is also connected to the input terminals of the second set of detector elements.

The detector can include a first bias electrode on the substrate which extends along the length of the linear array on one side thereof and is connected to the immediately adjacent input terminals of the first set of detector elements. The detector can also include a second bias electrode on the substrate which extends along the length of the linear array on the other side thereof and is connected to the immediately adjacent input terminals of the second set of detector elements. The first bias can include a first bias voltage connected to the first bias electrode and to the measurement devices for the second set of detector elements. The second bias can include a second bias voltage connected to the second bias electrode and to the measurement devices for the first set of detector elements. The first and second bias voltages are non-zero and are different from each other. In a preferred embodiment, the first bias voltage is a positive DC bias voltage and the second bias voltage is the negative of the first bias voltage.

The measurement devices attached to each detector element can be transimpedance amplifiers including an operational amplifier and a negative feedback loop. In this arrangement, the first bias is supplied to the operational amplifiers in the transimpedance amplifiers associated with the second set of detector elements and is supplied to the output terminals thereof through the negative feedback loop associated with the respective operational amplifier. In this arrangement, the second bias is supplied to the operational amplifiers in the transimpedance amplifiers associated with the first set of detector elements and is supplied to the output terminals thereof through the negative feedback loop associated with the respective operational amplifier. The detector elements are preferably photoconductive detectors, such as detectors operating in the infrared range.

We have also developed a method of testing a detector including a plurality of detector elements arranged on a substrate in a linear array and having a first bias electrode along one side of the linear array and connected to the input terminals of alternating of the detector elements and a second bias electrode extending along the opposite side of the linear array and connected to the input terminals of the remaining detector elements. The method uses the split bias arrangement discussed above.

BRIEF DESCRIPTION OF THE DRAWINGS

FIGS. 1A–1C are circuit diagrams showing, respectively, a voltage divider, a constant current and a constant voltage bias for a photoconductive detector element;

DESCRIPTION OF THE PREFERRED EMBODIMENTS

Figure 2:
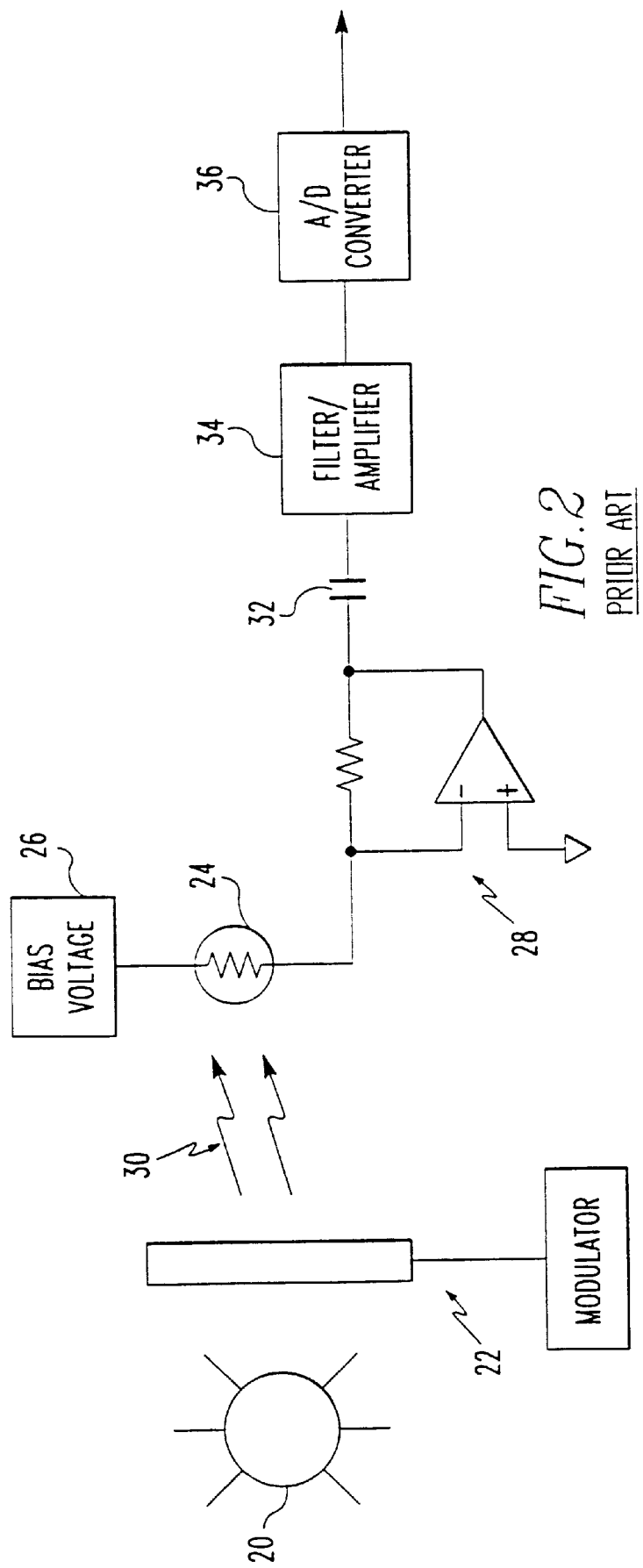
FIG. 2 is a circuit diagram of a detector system using the constant voltage bias circuit shown in FIG. 1C above.
Figure 3:
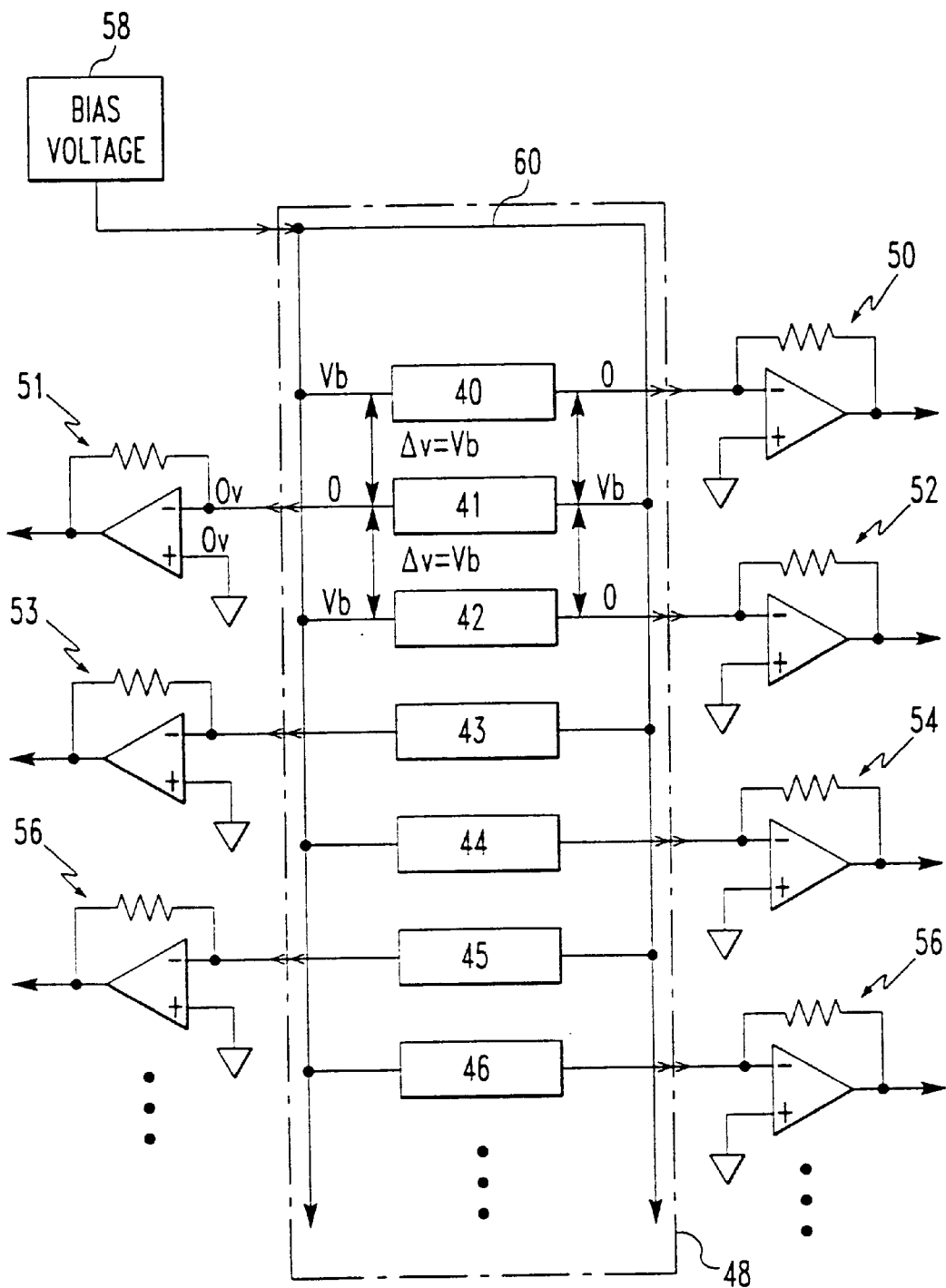
FIG. 3 is a circuit diagram showing a prior art interdigitated linear detector array using the constant voltage bias circuit shown in FIG. 1C.
Figure 4:
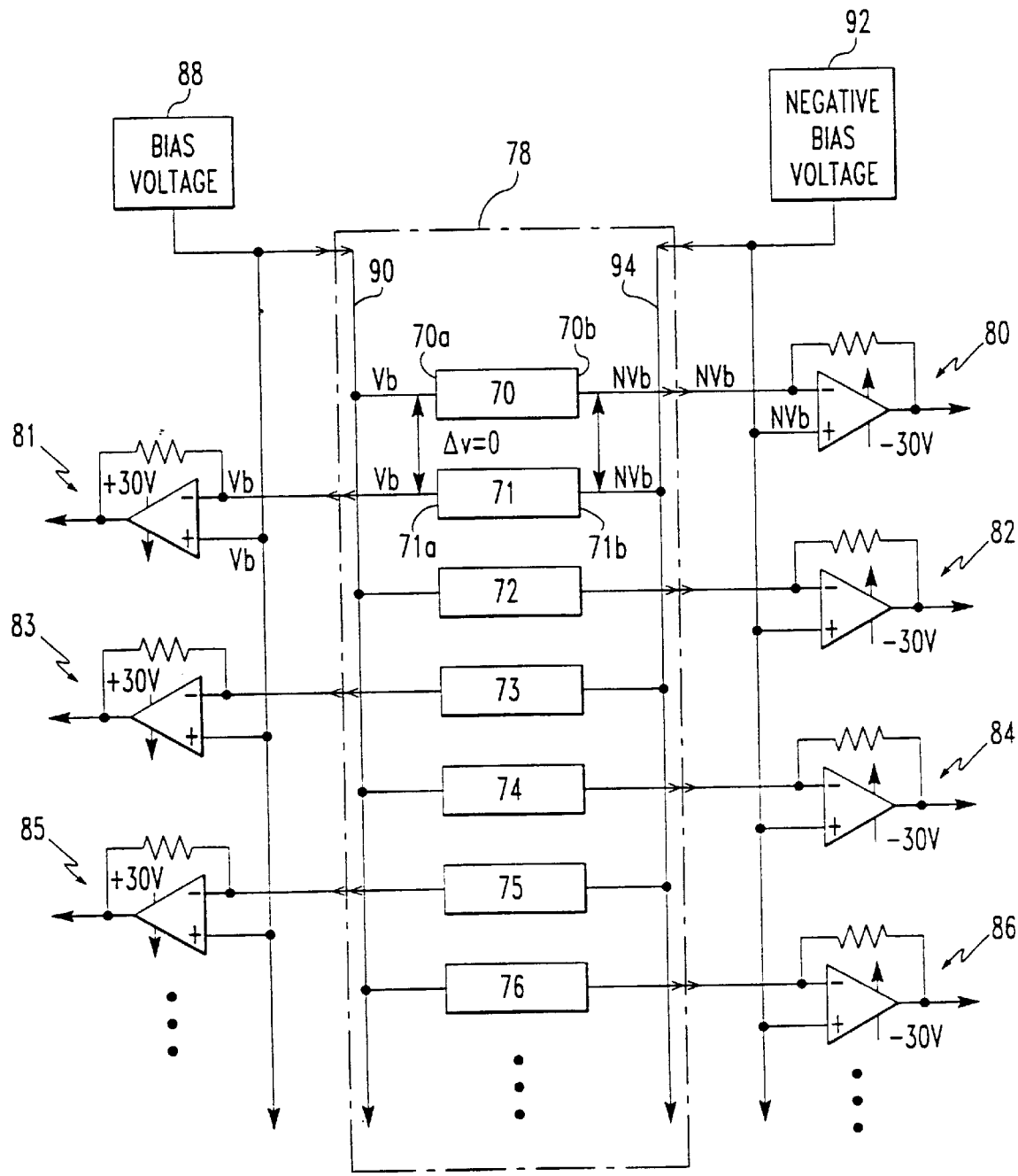
FIG. 4 is a circuit diagram showing an interdigitated linear detector array using a split bias in accordance with the present invention.

A preferred embodiment of a bias arrangement for an interdigitated linear array of photoconductive detector elements is shown in FIG. 4. Similar to FIG. 3 discussed above, a plurality of detector elements 70–76 is arranged on a substrate 78 in a linear array. Each detector element has an input terminal and an output terminal. Each detector element is positioned on the substrate 78 such that the input terminal of one detector element is adjacent the output terminal of a detector element immediately adjacent thereto and the output terminal of that one detector element is adjacent the input terminal of a detector element immediately adjacent thereto. For example, the detector element 70 shown in FIG. 4 has its input terminal 70a immediately adjacent the output terminal 71b of detector element 71 located immediately therebeneath. Similarly, detector element 71 has its input terminal 71a immediately beneath and adjacent the output terminal 70b of detector element 70 located immediately thereabove. FIG. 4 also shows that the output terminal of each detector element 70–76 is connected to a measurement device, here shown as transimpedance amplifiers 80–86 as discussed above in connection with FIGS. 1C, 2 and 3. Although only seven detector elements 70–76 are shown on the substrate 78 in FIG. 4, it is to be understood that a large number of detector elements and associated measurement devices are typically utilized.

In accordance with the present invention, a first bias voltage $V_b$ from bias voltage source 88 is connected to the input terminal of each odd detector element 70, 72, 74, 76 in the linear array by means of a first bias electrode 90 on the substrate 78. A second bias voltage $NV_b$ from a second or negative bias voltage source 92 is connected to the input terminal of the remaining or even detector elements 71, 73, 75 in the linear array by means of a second bias electrode 94 on the substrate 78. The first bias electrode 90 extends along the side of the substrate 78 adjacent the input terminals of the odd detector elements 70, 72, 74, 76 while the second bias electrode 94 is separate from the first bias electrode 90 and extends along the opposite side of the substrate 78 and adjacent the input terminals of the even detector elements 71, 73, 75. The first bias voltage $V_b$ is also supplied to the positive input terminals of the operational amplifiers in the transimpedance amplifiers 81, 83, 85 connected to the outputs of the even detector elements 71, 73, 75. Similarly, the second bias voltage $NV_b$ is connected to the positive input terminals of the operational amplifiers in the transimpedance amplifiers 80, 82, 84, 86 connected to the output terminals of the odd detector elements 70, 72, 74, 76. The first bias voltage $V_b$ or second bias voltage $NV_b$, respectively, is transferred through a feedback resistor to the negative input terminal of an operational amplifier and supplied to the output terminals of the detector elements associated therewith. In this manner, the input and output terminals of each detector element adjacent to each other along one side of the detector substrate will have the same voltage applied thereto and the potential difference between immediately adjacent elements will be zero.

As shown in FIG. 4, the first bias voltage $V_b$ is applied through the first bias electrode 90 to the input terminal 70a of detector element 70. Through negative feedback of the first bias voltage $V_b$ through transimpedance amplifier 81 connected to the output terminal 71b of adjacent detector element 71, the first bias voltage $V_b$ also appears at the output terminal $71_b$ of detector element 71. The voltage drop between the adjacent terminals 70a and 71b of detector elements 70 and 71 near the first bias electrode 90 is $V_b - V_b$ or zero as shown in FIG. 4. Similarly, the second bias voltage $NV_b$ is applied through the second bias electrode 94 to the input terminal 71a of detector element 71 and is applied through transimpedance amplifier 80 to the output terminal $70_b$ of detector element 70. The voltage drop between adjacent terminals 70b and 71a of detector elements 70 and 71 near the second bias electrode 94 is $NV_b - NV_b$ or zero as shown in FIG. 4. Similar voltages appear on the adjacent terminals of the remaining detector elements on the substrate 78.

This split biasing scheme virtually eliminates the potential difference between the input and output terminals of neighboring detector elements. Since the bias across each detector element is the difference between the first and second bias voltages, these bias voltages cannot be identical. By providing the first bias voltage of a particular potential and then providing the second bias voltage as the negative of the first bias voltage as shown in FIG. 4, the circuit can be balanced without additional complications. The bias voltages cannot be zero and cannot be of a higher potential than the supply voltage to the operational amplifiers in the transimpedance amplifiers. As shown in FIG. 4, the operational amplifiers in transimpedance amplifiers 80, 82, 84, 86 associated with the odd detector elements 70, 72, 74, 76 are supplied with zero volts on their positive rail and with −30 volts on their negative rail. The operational amplifiers in transimpedance amplifiers 81, 83, 85 associated with the even detector elements 71, 73, 75 are supplied with +30 volts on their positive rail and with zero volts on their negative rail. In a typical prior art arrangement, the operational amplifiers would be supplied with +15 volts on their positive rail and −15 volts on their negative rail. The voltages shown in FIG. 4 allow for the use of higher bias voltages to the detector elements and an increase in signal compliance range.

When a voltage divider arrangement is used for the biasing and measurement of radiation related signals, each load resistor must be adjusted to the particular detector element to achieve potential equalization since the resistance of each detector element may be different. For the same reason, the current source in a constant current bias arrangement must be matched to the resistance of the particular detector element. The constant voltage bias arrangement shown in FIG. 4 is preferred in that it does not require individual adjustment for each detector element since the transimpedance amplifier supplies the other bias voltage to the output terminals of the detector elements through negative feedback.

In addition to improving array reliability, the biasing arrangement shown in FIG. 4 permits simple testing of the linear array for contamination. When the substrate 78 is disconnected from its electronics and bias voltage sources, application of a DC potential between the two bias electrodes 90, 94 creates a potential between neighboring or adjacent array elements. This can be measured by means of a simple ohmmeter. In the absence of contaminants, the resistance observed between those electrodes will be nearly infinity. The presence of contaminants on the array will result in a much lower resistance as current starts to flow between neighboring detector elements. This simple test merely determines whether contaminants are present or not.

A more refined test can be performed with the array electronics and bias voltage sources attached to the substrate 78. The effect of inter-element potential can be measured by switching the bias voltage sources between the two bias electrodes 90, 94. The second bias voltage $NV_b$ is applied to the first bias electrode 90 normally carrying the first bias voltage $V_b$, while the first bias voltage $V_b$ is connected to the second bias electrode 94 normally carrying the second bias voltage $NV_b$. The bias voltages supplied to the transimpedance amplifiers 80–86 as shown in FIG. 4 remain the same. By analyzing, for example, the first two detector elements 70 and 71 in FIG. 4, it can be appreciated that the second bias voltage $NV_b$ would then be applied to both sides of detector element 70 while the first bias voltage $V_b$ would be applied to both sides of detector element 71. Because of the zero potential across each detector element, no current should flow to either transimpedance amplifier 80 or 81 in absence of contaminants. If contaminants are present, the potential difference of $V_b$—$NV_b$ applied between two adjacent detector elements, for example between input terminal 70a of detector element 70 and output terminal 71b of detector element 71 or between input terminal 71a of detector element 71 and output terminal 70b of detector element 70, will cause current to flow to either associated transimpedance amplifier or to both. The magnitude of these currents and their ratio allows one to assess the degree of contamination and to estimate the location of the contamination along the length of the associated detector elements.

Having described above the presently preferred embodiments of the present invention, it is to be understood that the invention may be otherwise embodied within the scope of the appended claims.

We claim:

1. A detector comprising a plurality of separate detector elements arranged on a substrate in a linear array, with each detector element having an input terminal and an output terminal, with each detector element positioned on the substrate such that the input terminal of each detector element is adjacent the output terminal of a detector element immediately adjacent thereto and the output terminal of each detector element is adjacent the input terminal of a detector element immediately adjacent thereto, a bias source connected to the input terminal of each detector element, and a measurement device connected to the output terminal of each detector element, wherein the bias source includes a first bias connected to the input terminals of a first set of detector elements including alternating detector elements and connected through an associated measurement device to the output terminals of a second set of detector elements including the remaining detector elements, and wherein the bias source includes a second bias different from the first bias and connected through an associated measurement device to the output terminals of the first set of detector elements and connected to the input terminals of the second set of detector elements.

2. The detector of claim 1 further including a first bias electrode on said substrate and extending along the length of said linear array on one side thereof and connected to the immediately adjacent input terminals of the first set of detector elements, and a second bias electrode on said substrate and extending along the length of said linear array on the other side thereof and connected to the immediately adjacent input terminals of the second set of detector elements.

3. The detector of claim 2 wherein the first bias includes a first bias voltage connected to said first bias electrode and to the measurement devices for the second set of detector elements and wherein the second bias includes a second bias voltage connected to the second bias electrode and to the measurement devices for the first set of detector elements, with the first and second bias voltages being non-zero and different from each other.

4. The detector of claim 3 wherein the first bias voltage is a positive DC bias voltage and the second bias voltage is the negative of the first bias voltage.

5. The detector of claim 1 wherein the measurement device attached to each detector element is a transimpedance amplifier including an operational amplifier and a negative feedback loop, wherein the first bias is supplied to each operational amplifier in the transimpedance amplifier associated with each of the second set of detector elements and is supplied to the output terminals thereof through the negative feedback loop associated with the respective operational amplifier, and wherein the second bias is supplied to each operational amplifier in the transimpedance amplifier associated with the first set of detector elements and is supplied to the output terminals thereof through the negative feedback loop associated with the respective operational amplifier.

6. The detector of claim 5 wherein the detector elements are photoconductive detectors.

7. The detector of claim 6 wherein the photoconductive detectors operate in the infrared range.

8. The detector of claim 6 wherein the detector elements are formed from the group consisting of PbS or PbSe.

9. The detector of claim 5 wherein the magnitude of the bias voltage is less than the magnitude of a supply voltage provided to the operational amplifiers in the transimpedance amplifiers.

10. A detector comprising a plurality of separate detector elements arranged on a substrate in a linear array, with each detector element having an input terminal and an output terminal, with each detector element positioned on the substrate such that the input terminal of each detector element is adjacent the output terminal of a detector element immediately adjacent thereto and the output terminal of each detector element is adjacent the input terminal of a detector element immediately adjacent thereto, a first bias electrode on said substrate and extending along the length of said linear array on one side thereof and connected to the immediately adjacent input terminals of a first set of alternating detector elements, and a second bias electrode on said substrate, separate from the first bias electrode, and extending along the length of said linear array on the other side thereof and connected to the immediately adjacent input terminals of a second set of the remaining alternating detector elements.

11. The detector of claim 10 wherein the detector elements are photoconductive detectors.

12. The detector of claim 11 wherein the photoconductive detectors operate in the infrared range.

13. The detector of claim 11 wherein the detector elements are formed from the group consisting of PbS or PbSe.

14. The method of testing the detector set forth in claim 10 comprising the steps of:
 a) applying a DC voltage between the first bias electrode and the second bias electrode, and
 b) measuring the resistance between the adjacent terminals of adjacent detector elements.

15. The method of testing the detector set forth in claim 10 comprising the steps of:
 a) connecting a transimpedance amplifier to the output terminal of each detector element,
 b) applying a first DC bias voltage to the second bias electrode and, through the associated transimpedance amplifier, to the output terminals of the second set of detector elements,
 c) applying a second DC bias voltage, different from the first DC bias voltage, to the first bias electrode and, through the associated transimpedance amplifier, to the output terminals of the first set of detector elements, and
 d) measuring the currents flowing to the transimpedance amplifiers.

16. The detector of claim 2, wherein the measurement device attached to each detector element is a transimpedance amplifier including an operational amplifier and a negative feedback loop, wherein the first bias is supplied to each operational amplifier in the transimpedance amplifier associated with each of the second set of detector elements and is supplied to the output terminals thereof through the negative feedback loop associated with the respective operational amplifier, and wherein the second bias is supplied to each operational amplifier in the transimpedance amplifier associated with the first set of detector elements and is supplied to the output terminals thereof through the negative feedback loop associated with the respective operational amplifier.

17. The detector of claim 3, wherein the measurement device attached to each detector element is a transimpedance amplifier including an operational amplifier and a negative feedback loop, wherein the first bias is supplied to each operational amplifier in the transimpedance amplifier associated with each of the second set of detector elements and is supplied to the output terminals thereof through the negative feedback loop associated with the respective operational amplifier, and wherein the second bias is supplied to each operational amplifier in the transimpedance amplifier associated with the first set of detector elements and is supplied to the output terminals thereof through the negative feedback loop associated with the respective operational amplifier.

18. The detector of claim 4, wherein the measurement device attached to each detector element is a transimpedance amplifier including an operational amplifier and a negative feedback loop, wherein the first bias is supplied to each operational amplifier in the transimpedance amplifier associated with each of the second set of detector elements and is supplied to the output terminals thereof through the negative feedback loop associated with the respective operational amplifier, and wherein the second bias is supplied to each operational amplifier in the transimpedance amplifier associated with the first set of detector elements and is supplied to the output terminals thereof through the negative feedback loop associated with the respective operational amplifier.

* * * * *